(12) United States Patent
Wang

(10) Patent No.: US 11,774,817 B2
(45) Date of Patent: Oct. 3, 2023

(54) PIXEL STRUCTURE AND DISPLAY DEVICE

(71) Applicant: TCL China Star Optoelectronics Technology Co., Ltd., Guangdong (CN)

(72) Inventor: Zui Wang, Guangdong (CN)

(73) Assignee: TCL China Star Optoelectronics Technology Co., Ltd., Guangdong (CN)

(*) Notice: Subject to any disclaimer, the term of this patent is extended or adjusted under 35 U.S.C. 154(b) by 329 days.

(21) Appl. No.: 16/617,179

(22) PCT Filed: Oct. 29, 2019

(86) PCT No.: PCT/CN2019/114091
§ 371 (c)(1),
(2) Date: Nov. 26, 2019

(87) PCT Pub. No.: WO2021/042469
PCT Pub. Date: Mar. 11, 2021

(65) Prior Publication Data
US 2021/0405425 A1 Dec. 30, 2021

(30) Foreign Application Priority Data
Sep. 3, 2019 (CN) .......................... 201910828485.6

(51) Int. Cl.
*G02F 1/1362* (2006.01)
*H01L 27/12* (2006.01)
*G02F 1/1343* (2006.01)

(52) U.S. Cl.
CPC ...... *G02F 1/136286* (2013.01); *H01L 27/124* (2013.01); *G02F 1/134336* (2013.01); *G02F 2201/40* (2013.01)

(58) Field of Classification Search
CPC ......... G02F 1/136213; G02F 1/136286; G02F 1/134309; G02F 1/134336; G02F 2201/40; H01L 27/124
See application file for complete search history.

(56) References Cited

U.S. PATENT DOCUMENTS

| 7,545,356 B2 | 6/2009 | HoeSup |
| 8,368,630 B2 * | 2/2013 | Lee ................... G02F 1/134309 345/93 |
| 9,740,069 B2 | 8/2017 | Zheng |

(Continued)

FOREIGN PATENT DOCUMENTS

| CN | 1885140 A | 12/2006 |
| CN | 101308299 A | 11/2008 |
| CN | 101634786 A | 1/2010 |

(Continued)

*Primary Examiner* — Paisley L Wilson
(74) *Attorney, Agent, or Firm* — PV IP PC; Wei Te Chung; Zhigang Ma

(57) ABSTRACT

A pixel structure and a display device are provided. The pixel structure includes a first metal layer, a transparent electrode layer, and a second metal layer. The first metal layer includes a plurality of first metal lines, a plurality of second metal lines, and a third metal line. The transparent electrode layer is disposed in a space formed by the first metal layer. The second metal layer is disposed over the first metal layer and the transparent electrode layer and disposed on a side of the transparent electrode layer.

5 Claims, 3 Drawing Sheets

(56) References Cited

U.S. PATENT DOCUMENTS

2015/0249098 A1 9/2015 Zhang et al.
2018/0203305 A1* 7/2018 Xian .................. H01L 29/78633

FOREIGN PATENT DOCUMENTS

| CN | 103728800 A | 4/2014 |
| CN | 103838048 A | 6/2014 |
| CN | 106094377 A | 11/2016 |
| CN | 108873531 A | 11/2018 |

* cited by examiner

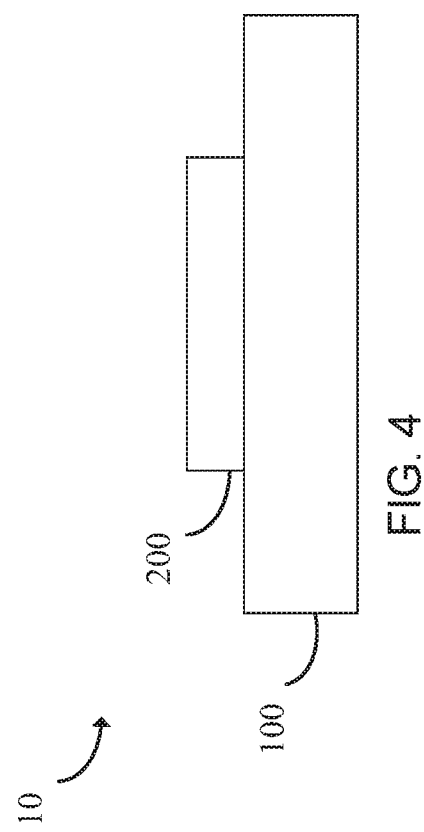

PIXEL STRUCTURE AND DISPLAY DEVICE

CROSS-REFERENCE TO RELATED APPLICATIONS

This application is a U.S. National Phase of International PCT Application No. PCT/CN2019/114091 filed Oct. 29, 2019, which claims the benefit of Chinese Patent Application Serial No. 201910828485.6 filed Sep. 3, 2019, the contents of each application are incorporated herein by reference in their entirety.

FIELD OF INVENTION

The present disclosure relates to the field of display technologies, and more particularly to a pixel structure and a display device.

BACKGROUND OF INVENTION

Current liquid crystal displays often exhibit color shift when viewed from a large viewing angle. Generally, first common electrode lines and second common electrode lines are perpendicular to each other, and in a pixel structure, the first common electrode lines, the second common electrode lines, and a gate line are different layer metals, and the second common electrode lines are perpendicular to the gate line and extend through all of pixel areas. A disadvantage of such a design is that the second common electrode lines occupy display areas of too many pixels, resulting in a decrease in transmittance of the pixels and an electrical offset of the pixels due to illumination on the pixels in processes.

Therefore, there is a need to provide a pixel structure and a display device to solve issues of the prior art.

SUMMARY OF INVENTION

In order to solve the above technical problems, an object of an embodiment of the present disclosure is to provide a pixel structure and a display device capable of improving transmittance of the pixel structure.

To achieve the above object, an embodiment of the present disclosure provides a pixel structure. The pixel structure includes a first metal layer, a transparent electrode layer, and a second metal layer. The first metal layer includes a plurality of first metal lines, a plurality of second metal lines, and a third metal line. The first metal lines, the second metal lines, and the third metal line form a plurality of spaces. The transparent electrode layer is disposed in the spaces formed by the first metal layer. The second metal layer is disposed over the first metal layer and the transparent electrode layer.

In an embodiment of the present disclosure, the second metal layer is disposed on a side of the transparent electrode layer.

In an embodiment of the present disclosure, the first metal lines are a plurality of first common electrode lines, the second metal lines are a plurality of second common electrode lines, the third metal line is a gate line, and the second metal layer includes a data line.

In an embodiment of the present disclosure, the second common electrode lines and the gate line are parallel to each other.

In an embodiment of the present disclosure, an extending direction of a first portion of each of the first common electrode lines and the gate line are perpendicular to each other, and a second portion of each of the first common electrode lines and the gate line are parallel to each other.

In an embodiment of the present disclosure, the transparent electrode layer is disposed in a space formed by the first portion of each of the first common electrode lines and the second portion of each of the first common electrode lines.

In an embodiment of the present disclosure, the pixel structure further includes a display area, the first common electrode lines and the second common electrode lines are parallel to each other and are interleaved to the display area.

In an embodiment of the present disclosure, the pixel structure further includes a pixel non-transmissive area, the second common electrode lines and the gate line pass through the pixel non-transmissive area in parallel with each other.

In an embodiment of the present disclosure, the pixel structure further includes a pixel non-transmissive area, a projection of each of the data lines on the pixel non-transmissive area and a projection of the transparent electrode layer on the pixel non-transmissive area do not overlap.

An embodiment of the present disclosure further provides a display device. The display device includes a substrate and a pixel structure disposed on the substrate. The pixel structure includes a first metal layer, a transparent electrode layer, and a second metal layer. The first metal layer includes a plurality of first metal lines, a plurality of second metal lines, and a third metal line. The first metal lines, the second metal lines, and the third metal line form a plurality of spaces. The transparent electrode layer is disposed in the spaces formed by the first metal layer. The second metal layer is disposed over the first metal layer and the transparent electrode layer.

In an embodiment of the present disclosure, the second metal layer is disposed on a side of the transparent electrode layer.

In an embodiment of the present disclosure, the first metal lines are a plurality of first common electrode lines, the second metal lines are a plurality of second common electrode lines, the third metal line is a gate line, and the second metal layer includes a data line.

In an embodiment of the present disclosure, the second common electrode lines and the gate line are parallel to each other.

In an embodiment of the present disclosure, an extending direction of a first portion of each of the first common electrode lines and the gate line are perpendicular to each other, and a second portion of each of the first common electrode lines and the gate line are parallel to each other.

In an embodiment of the present disclosure, the transparent electrode layer is disposed in a space formed by the first portion of each of the first common electrode lines and the second portion of each of the first common electrode lines.

In an embodiment of the present disclosure, the pixel structure further includes a display area, the first common electrode lines and the second common electrode lines are parallel to each other and are interleaved to the display area.

In an embodiment of the present disclosure, the pixel structure further includes a pixel non-transmissive area, the second common electrode lines and the gate line pass through the pixel non-transmissive area in parallel with each other.

In an embodiment of the present disclosure, the pixel structure further includes a pixel non-transmissive area, a projection of each of the data lines on the pixel non-transmissive area and a projection of the transparent electrode layer on the pixel non-transmissive area do not overlap.

Beneficial effects of an embodiment of the present disclosure are that, in the pixel structure and the display device of the embodiment of the present disclosure, the pixel structure includes the first metal layer, the transparent electrode layer, and the second metal layer. The first metal layer includes the first metal lines, the second metal lines, and the third metal line. The first metal lines, the second metal lines, and the third metal line form a plurality of spaces. The transparent electrode layer is disposed in the spaces formed by the first metal layer. The second metal layer is disposed over the first metal layer and the transparent electrode layer. The embodiment of the present disclosure can increase transmittance of the pixel structure.

DESCRIPTION OF DRAWINGS

FIG. 4 is a schematic structural diagram of a display device according to an embodiment of the present disclosure.

DETAILED DESCRIPTION OF PREFERRED EMBODIMENTS

Figure 1:
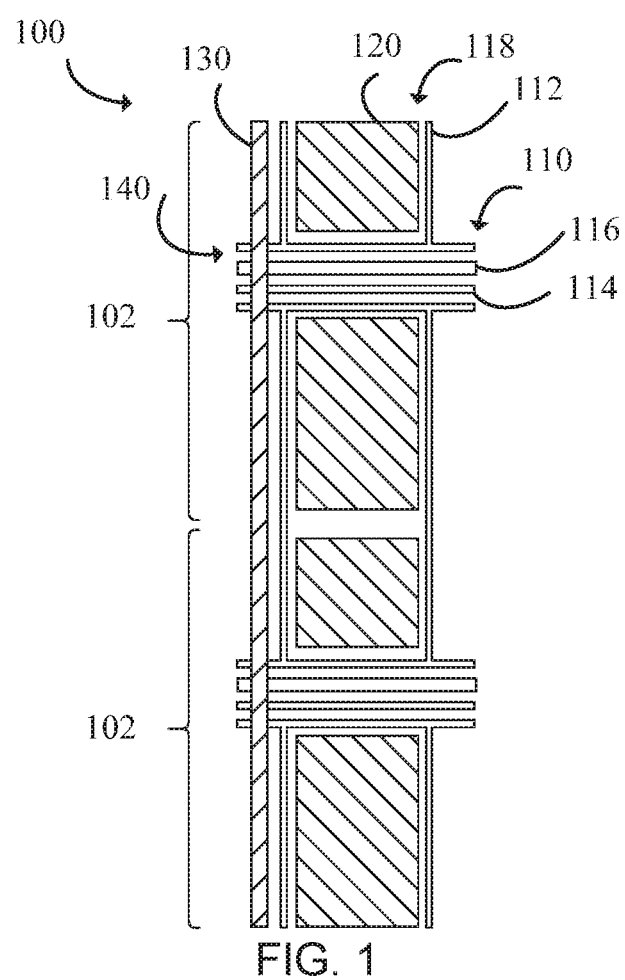
FIG. 1 is a schematic structural diagram of a pixel structure according to an embodiment of the present disclosure.

The following description of the various embodiments is provided to illustrate the specific embodiments by referring to the accompanying drawings.

The above and other objects, features, and advantages of the present disclosure will be more apparent and obvious. Hereinafter, the preferred embodiments of the present disclosure will be described in detail with reference to the accompanying drawings. In addition, directional terms described by the present disclosure, such as up, down, top, bottom, front, back, left, right, inner, outer, side, surrounding, central, level, horizontal, vertical, perpendicular, axial, radial, uppermost, lowermost, etc., are only directions by referring to the accompanying drawings, and thus the used terms are used only for the purpose of describing embodiments of the present disclosure and are not intended to be limiting of the present disclosure.

In the drawings, units with similar structures are labeled with the same reference number.

Figure 2:
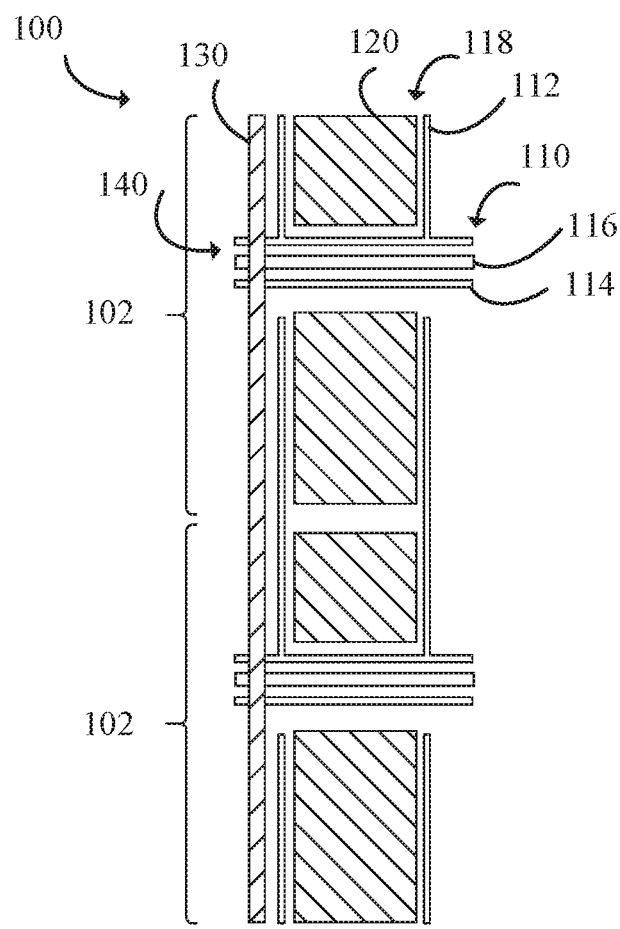
FIG. 2 is a schematic structural diagram of a pixel structure according to an embodiment of the present disclosure.

Referring to FIG. 1 and FIG. 2, an embodiment of the present disclosure provides a pixel structure 100. The pixel structure 100 includes a plurality of pixels 102. The pixel structure 100 includes a first metal layer 110, a transparent electrode layer 120, and a second metal layer 130. The first metal layer 110 includes a plurality of first metal lines 112, a plurality of second metal lines 114, and a third metal line 116. The first metal lines 112, the second metal lines 114, and the third metal line 116 form a plurality of spaces 118. The transparent electrode layer 120 is disposed in the spaces 118 formed by the first metal lines 112, the second metal lines 114, and the third metal line 116. The second metal layer 130 is disposed over the first metal layer 110 and the transparent electrode layer 120. The embodiment of the present disclosure can increase transmittance of the pixel structure 100.

Referring to FIG. 1 and FIG. 2, in an embodiment of the present disclosure, the second metal layer 130 is disposed on a side of the transparent electrode layer 120. In an embodiment of the present disclosure, the first metal lines 112 are a plurality of first common electrode lines 112, the second metal lines 114 are a plurality of second common electrode lines 114, the third metal line 116 is a gate line 116, and the second metal layer 130 includes a data line 130.

Referring to FIG. 1 and FIG. 2, in an embodiment of the present disclosure, the second common electrode lines 114 and the gate line 116 are parallel to each other. An extending direction of a first portion of each of the first common electrode lines and the gate line are perpendicular to each other, and a second portion of each of the first common electrode lines and the gate line are parallel to each other. The transparent electrode layer is disposed in a space formed by the first portion of each of the first common electrode lines and the second portion of each of the first common electrode lines. In an embodiment of the present disclosure, the pixel structure 100 further includes a pixel non-transmissive area 140, and the second common electrode lines 114 and the gate line 116 pass through the pixel non-transmissive area 140 in parallel with each other.

Referring to FIG. 1, in an embodiment of the present disclosure, new lines of the same layer (the first metal layer 110) as the gate line 116 are added as the second common electrode lines 114. The second common electrode lines 114 and the gate line 116 pass through the pixel non-transmissive area 140 in parallel with each other.

Referring to FIG. 1 and FIG. 2, in an embodiment of the present disclosure, the pixel structure 100 includes the pixel non-transmissive area 140, a projection of the data line 130 on the pixel non-transmissive area 140 and a projection of the transparent electrode layer 120 on the pixel non-transmissive area 140 do not overlap.

Referring to FIG. 2, in an embodiment of the present disclosure, the second metal lines 114 are a plurality of intermittent second common electrode lines 114. In an embodiment of the present disclosure, an original structure of the first common electrode lines is disassembled into two parts, a portion of the first common electrode lines perpendicular to the gate line 116 is still the first common electrode lines 112, a portion of the first common electrode lines parallel to the gate line 116 is the second common electrode lines 114, and an aperture ratio of this embodiment is larger.

Figure 3:
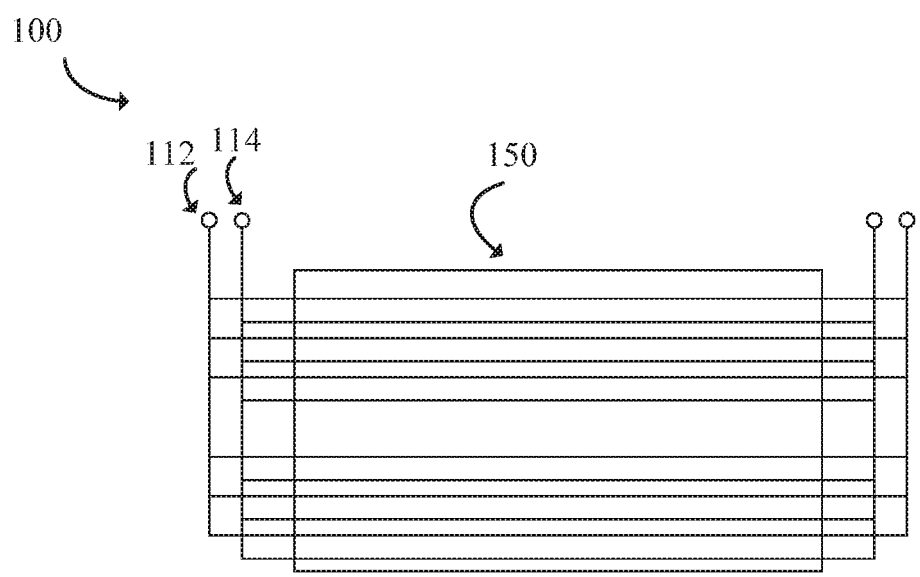
FIG. 3 is a schematic structural diagram of a pixel structure according to an embodiment of the present disclosure.

Referring to FIG. 3, in an embodiment of the present disclosure, the pixel structure 100 further includes a display area 150, and the first common electrode lines 112 and the second common electrode lines 114 are parallel to each other and are interleaved to the display area 150.

Referring to FIG. 4, an embodiment of the present disclosure further provides a display device 10. The display device 10 includes a substrate 200 and the pixel structure 100 as described above. The pixel structure 100 is disposed on the substrate 200. The display device is, for example, one of a variety of consumer electronic products such as a mobile phone, a television, a personal digital assistant, a digital camera, a notebook computer, or the like.

Due to the pixel structure and the display device in the embodiment of the present disclosure, line distribution pattern and layer of the second common electrode lines are changed, such that the second common electrode lines are parallel to the gate line, and the first common electrode lines and the second common electrode lines are staggered in parallel with each other to the display area, transmittance of the pixel structure is improved under the premise of ensuring a color shift improvement performance of large viewing angles. Moreover, because the second common electrode lines are the first metal layer, a semiconductor layer is not present under a mask process, and issues of photo-generated carriers generated by the semiconductor layer being exposed to light are avoided.

In summary, beneficial effects of an embodiment of the present disclosure are that, in the pixel structure and the display device of the embodiment of the present disclosure, the pixel structure includes the first metal layer, the transparent electrode layer, and the second metal layer. The first metal layer includes the first metal lines, the second metal lines, and the third metal line. The first metal lines, the second metal lines, and the third metal line form a plurality of spaces. The transparent electrode layer is disposed in the spaces formed by the first metal layer. The second metal layer is disposed over the first metal layer and the transparent electrode layer. The embodiment of the present disclosure can increase transmittance of the pixel structure.

Although the present disclosure is described via one or more embodiments, those of ordinary skill in the art can come up with equivalent variations and modifications based upon the understanding of the specification and the accompanying drawings. The present disclosure includes all such modifications and variations and is only limited by the scope of the appended claims. In particular, as to the various functions performed by the components described above, the terms used to describe the components are intended to correspond to any component performing the specific functions (e.g., which are functionally equivalent) of the components (unless otherwise indicated), even those which are structurally different from the disclosed structure for performing the functions in the exemplary embodiments in the specification shown herein. In addition, although a particular feature in the specification is disclosed in only one of many embodiments, this feature may be combined with one or more features in other embodiments which are desirable and advantageous to a given or particular application. Moreover, the terms "include", "have", "consist of", or variations thereof used in the detailed description or the claims are intended to be used in a manner similar to the term "comprising".

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

What is claimed is:

1. A pixel structure, comprising:
   a first metal layer comprising:
      a gate line;
      a first common electrode line comprising a first portion perpendicular to the gate line, and a second portion parallel to and adjacent to the gate line, wherein a space is formed by the first portion of the first common electrode line and the second portion of the first common electrode line; wherein the space is across two pixels, and a portion of the space in one of the two pixels is formed by a third portion of the first common electrode line, wherein at least the first portion of the first common electrode line of two portions which are the first portion of the first common electrode line and the second portion of the first common electrode line comprises the third portion of the first common electrode line; and wherein the first portion of the first common electrode line comprises two fourth portions perpendicular to the gate line and disposed between two adjacent gate lines, and two ends of the two fourth portions adjacent to the gate line are connected to the second portion of the first common electrode line; and
   a second common electrode line, wherein the first common electrode line and the second common electrode line are electrically separated from each other; wherein the second common electrode line and the gate line pass through a pixel non-transmissive area in parallel with each other, the gate line is disposed between the second common electrode line and the second portion of the first common electrode line in each of the two pixels, and another two ends of the two fourth portions are adjacent to the second common electrode line and are disconnected; and wherein the pixel non-transmissive area is in the one of the two pixels and is adjacent to the portion of the space; and
   a transparent electrode layer disposed in the space.

2. The pixel structure according to claim 1, further comprising a display area, wherein there are a plurality of the first common electrode lines and a plurality of the second common electrode lines, wherein the second portions of the first common electrode lines and the second common electrode lines are parallel to each other and are interleaved to the display area.

3. A display device, having a display area, and comprising:
   a substrate; and
   a pixel structure disposed on the substrate;
   wherein the pixel structure comprises:
      a first metal layer comprising:
         a gate line;
         a first common electrode line comprising a first portion perpendicular to the gate line, and a second portion parallel to and adjacent to the gate line, wherein a space is formed by the first portion of the first common electrode line and the second portion of the first common electrode line; wherein the space is across two pixels, and a portion of the space in one of the two pixels is formed by a third portion of the first common electrode line, wherein at least the first portion of the first common electrode line of two portions which are the first portion of the first common electrode line and the second portion of the first common electrode line comprises the third portion of the first common electrode line; and wherein the first portion of the first common electrode line comprises two fourth portions perpendicular to the gate line and disposed between two adjacent gate lines, and two ends of the two fourth portions adjacent to the gate line are connected to the second portion of the first common electrode line; and
         a second common electrode line, wherein the first common electrode line and the second common electrode line are electrically separated from each other; wherein the second common electrode line and the gate line pass through a pixel non-transmissive area in parallel with each other, the gate line is disposed between the second common electrode line and the second portion of the first common electrode line in each of the two pixels, and another two ends of the two fourth portions are adjacent to the second common electrode line and are disconnected; and wherein the pixel non-transmissive area is in the one of the two pixels and is adjacent to the portion of the space; and a transparent electrode layer disposed in the space.

4. The display device according to claim 3, wherein there are a plurality of the first common electrode lines and a plurality of the second common electrode lines, wherein the second portions of the first common electrode lines and the second common electrode lines are parallel to each other and are interleaved to the display area.

5. The display device according to claim 3, further comprising:

a plurality of the first common electrode lines and a plurality of the second common electrode lines;

a first main common electrode line disposed in an area out of the display area and perpendicular to the second portions of the first common electrode lines, wherein the second portions of the first common electrode lines are connected to the first main common electrode line; and a second main common electrode line disposed in the area out of the display area and parallel to the first main common electrode line, wherein the second common electrode lines are connected to the second main common electrode line.

* * * * *